(12) United States Patent
Niu et al.

(10) Patent No.: US 11,276,739 B2
(45) Date of Patent: Mar. 15, 2022

(54) DISPLAY SUBSTRATE, ADJUSTMENT METHOD THEREOF, AND DISPLAY APPARATUS

(71) Applicant: BOE TECHNOLOGY GROUP CO., LTD., Beijing (CN)

(72) Inventors: Yanan Niu, Beijing (CN); Jiushi Wang, Beijing (CN); Zhanfeng Cao, Beijing (CN); Qi Yao, Beijing (CN); Feng Zhang, Beijing (CN); Wusheng Li, Beijing (CN); Feng Guan, Beijing (CN); Lei Chen, Beijing (CN); Hongwei Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/765,232

(22) PCT Filed: Nov. 26, 2019

(86) PCT No.: PCT/CN2019/120935
§ 371 (c)(1),
(2) Date: May 19, 2020

(87) PCT Pub. No.: WO2020/173153
PCT Pub. Date: Sep. 3, 2020

(65) Prior Publication Data
US 2021/0225975 A1    Jul. 22, 2021

(30) Foreign Application Priority Data
Feb. 26, 2019  (CN) .......................... 201910142601.9

(51) Int. Cl.
*H01L 27/32* (2006.01)

(52) U.S. Cl.
CPC .... *H01L 27/3262* (2013.01); *H01L 2227/323* (2013.01)

(58) Field of Classification Search
CPC .................. H01L 27/3262; H01L 2227/323
(Continued)

(56) References Cited

U.S. PATENT DOCUMENTS

| 9,673,334 B2 | 6/2017 | Chen |
| 2011/0175674 A1* | 7/2011 | Shimizu ............ H01L 29/78606 327/537 |

(Continued)

FOREIGN PATENT DOCUMENTS

| CN | 104538456 A | 4/2015 |
| CN | 106847834 A | 6/2017 |

(Continued)

OTHER PUBLICATIONS

International Search Report dated Feb. 26, 2020, issued in counterpart application No. PCT/CN2019/120935 (11 pages).

*Primary Examiner* — Dzung Tran
(74) *Attorney, Agent, or Firm* — Westerman, Hattori, Daniels & Adrian, LLP

(57) ABSTRACT

A display substrate is provided. The display substrate includes a substrate (1), a first transistor (2) and a second transistor (3) on the substrate (1), directions of intrinsic threshold voltage shifts of the first transistor (2) and the second transistor (3) being opposite; and a shift adjustment structure (4) on the substrate (1). The shift adjustment structure (4) may be configured to input adjustment signals to the first transistor (2) and the second transistor (3) respectively to make threshold voltages of the first transistor (2) and the second transistor (3) shift in directions opposite to the directions of their intrinsic threshold voltage shifts respectively.

16 Claims, 6 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2015/0187959 A1* | 7/2015 | Yoon | H01L 29/78633 |
| | | | 257/43 |
| 2015/0311232 A1* | 10/2015 | Sun | H01L 27/124 |
| | | | 257/72 |
| 2017/0294497 A1 | 10/2017 | Lius et al. | |
| 2018/0061859 A1 | 3/2018 | Wen | |
| 2018/0122882 A1* | 5/2018 | Lee | H01L 27/3258 |
| 2018/0175077 A1* | 6/2018 | Koo | H01L 27/127 |
| 2019/0348449 A1 | 11/2019 | Gui et al. | |

FOREIGN PATENT DOCUMENTS

| | | |
|---|---|---|
| CN | 106920804 A | 7/2017 |
| CN | 109273404 A | 1/2019 |

* cited by examiner

DISPLAY SUBSTRATE, ADJUSTMENT METHOD THEREOF, AND DISPLAY APPARATUS

CROSS-REFERENCE TO RELATED APPLICATIONS

This application claims benefit of the filing date of Chinese Patent Application No. 201910142601.9 filed on Feb. 26, 2019, the disclosure of which is hereby incorporated in its entirety by reference.

TECHNICAL FIELD

The present disclosure relates to display technologies, and in particular, to a display substrate, an adjustment method thereof, and a display apparatus.

BACKGROUND

Organic electroluminescent display (OLED/LED) panels have become the mainstream of the display field due to their excellent performance of low power consumption, high color saturation, wide viewing angle, small thickness, and flexibility. They have been widely used in terminal products such as smart phones, tablets, and TVs. Among them, flexible OLED/LED products are most prominent, and gradually become the mainstream of OLED/LED displays because they can meet various requirements of special structures. Since they can be made in a variety of shapes and arranged in various areas with a small thickness, their flexibility expands to a wide range of applications such as mobile terminals, watches, and various wearable products. In actual use, because the apparatus itself needs to consume a certain amount of power, low power consumption and long battery life have become very important aspects in long-term working conditions, especially in places that charging is relatively inconvenient during travel or other field environments.

APPARATUS BRIEF SUMMARY

One embodiment of the present disclosure is a display substrate. The display substrate may include a substrate; a first transistor and a second transistor on the substrate, directions of intrinsic threshold voltage shifts of the first transistor and the second transistor being opposite; and a shift adjustment structure on the substrate. The shift adjustment structure may be configured to input adjustment signals to the first transistor and the second transistor respectively to make threshold voltages of the first transistor and the second transistor shift in directions opposite to the directions of their intrinsic threshold voltage shifts respectively.

Optionally, the shift adjustment structure comprises an adjustment signal source, a switch unit and a signal lead, the adjustment signal source is connected to the switch unit, and the switch unit is connected to the signal lead; the adjustment signal source is configured to generate a first adjustment signal and a second adjustment signal that adjust the intrinsic threshold voltage shifts of the first transistor and the second transistor respectively; the switch unit is configured to turn on or off the adjustment signal source; and the signal lead comprises a first lead and a second lead, the first lead is configured to input the first adjustment signal to the first transistor, and the second lead is configured to input the second adjustment signal to the second transistor.

Optionally, the first transistor and the second transistor are top gate transistors, the first lead is at a side of the first transistor facing the substrate, and the second lead is at a side of the second transistor facing the substrate.

Optionally, the first lead forms a bottom gate of the first transistor, and the second lead forms a bottom gate of the second transistor, thereby making the first transistor and the second transistor respectively form a double gate structure.

Optionally, the display substrate further comprises a first conductive layer on the substrate and at the side of the first transistor and the second transistor facing the substrate; wherein the first lead and the first conductive layer are made of a same material and are disposed in a same layer.

Optionally, the second lead and a gate of the first transistor are made of a same material and are disposed in a same layer.

Optionally, the adjustment signal source comprises a first signal source and a second signal source, the first signal source is configured to generate the first adjustment signal, and the second signal source is configured to generate the second adjustment signal.

Optionally, a gate driving signal source of the first transistor is reused as the second signal source, and a gate driving signal source of the second transistor is reused as the first signal source.

Optionally, the first transistor is a PNP transistor and the second transistor is an NPN transistor.

Optionally, the first transistor is a low temperature polysilicon transistor and the second transistor is an oxide semiconductor transistor.

Optionally, the display substrate further comprises a first insulating layer, wherein the first insulating layer is below the gate of the first transistor and below a source and a drain of the first transistor, the first insulating layer further extends between the second lead and an active layer of the second transistor; the first insulating layer comprises via holes at positions corresponding to the gate, the source, and the drain of the first transistor, a contact layer is in each of the via holes, and the contact layer and the active layer of the second transistor are made of a same material and arranged in a same layer.

Optionally, the display substrate further comprises a second insulating layer on the contact layer, wherein the second insulating layer also extends above the active layer of the second transistor.

Optionally, the display substrate further comprises a gate insulating layer between the gate and the active layer of the first transistor and between the gate and the active layer of the second transistor.

Optionally, the display substrate comprises a plurality of regions, each of the plurality of regions comprising the first transistor and the second transistor.

Optionally, each of the plurality of regions further comprises the first lead and the second lead which are correspondingly configured to connect with the switch unit.

One embodiment of the present disclosure is a display apparatus comprising the display substrate according to one embodiment of the present disclosure.

One embodiment of the present disclosure is a method for adjusting the display substrate according to one embodiment of the present disclosure, comprising inputting the first adjustment signal and the second adjustment signal to the first transistor and the second transistor respectively such that the threshold voltages of the first transistor and the second transistor respectively shift in directions opposite to the directions of the intrinsic threshold voltage shifts of the first transistor and the second transistor.

Optionally, the first adjustment signal and the second adjustment signal have opposite polarities.

Optionally, the first adjustment signal and the second adjustment signal are unequal in magnitude and/or the first adjustment signal and the second adjustment signal are unequal in input duration.

One embodiment of the present disclosure is a method of fabricating the display substrate, comprising forming a first conductive layer and a first lead on a substrate; forming a first insulating layer and etching the first insulating layer, reserving first signal connection holes in the first insulating layer connecting to the first lead, a source, a drain, and the gate of the first transistor, forming an active layer of the second transistor and at the same time depositing a contact layer at each of the signal connection holes in the first insulating layer; forming a second insulating layer and etching the second insulating layer, reserving second signal connection holes in the second insulating layer connecting to the first lead, the source, the drain, and the gate of the first transistor, and a source, a drain, and the gate of the second transistor, and forming the source and the drain of the first transistor, the source and the drain of the second transistor, and at the same time depositing a layer of the source and drain material in the second signal connection holes corresponding to the gate of the first transistor, the gate of the second transistor, and the first lead.

BRIEF DESCRIPTION OF THE DRAWINGS

The drawings are intended to provide a further understanding of the technical solutions of the present disclosure, and are intended to be a part of the specification, and are used to explain the technical solutions of the present disclosure, and do not constitute a limitation of the technical solutions of the present disclosure.

DETAILED DESCRIPTION

The present disclosure will be described in further detail with reference to the accompanying drawings and embodiments in order to provide a better understanding by those skilled in the art of the technical solutions of the present disclosure. In the description of the following embodiments, specific features, structures, materials or characteristics may be combined in any suitable manner in any one or more embodiments or examples.

At present, a LTPO (LTPS-Oxide) process is being developed, which refers to a process that employs both low temperature polysilicon transistors (LTPS TFTs) and oxide transistors (Oxide TFTs) in a display panel. The use of low leakage oxide transistors can reduce leakage current to further lower display panel power consumption. However, in the actual process, due to low compatibility between the LTPS TFT and the Oxide TFT processes, some transistors are subject to a threshold voltage shift. Moreover, the shift directions of the LTPS TFT and the Oxide TFT are opposite due to their existing structures. That is, the threshold voltages of the two types of transistors may shift in crossing or opposite directions, which makes the display apparatus unable to work normally or even be turned on. Furthermore, the transistors prone to the threshold voltage shift may distribute at random places and the degrees of threshold voltage shift may also be random. Therefore, it is currently impossible to perform a single adjustment with a simple fabrication process.

Figure 1:
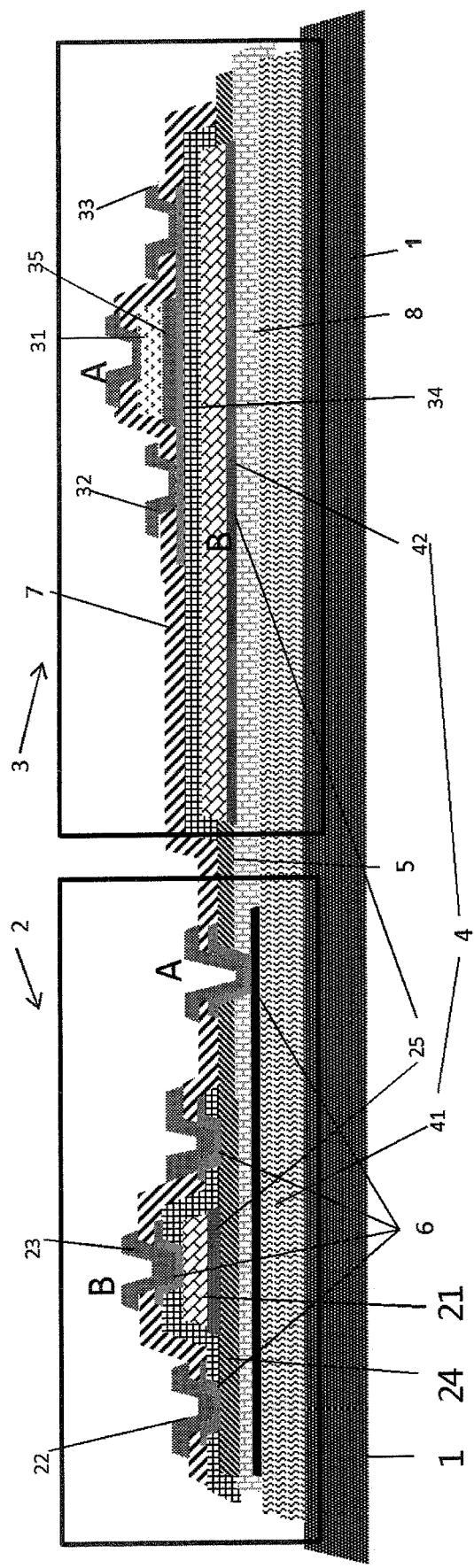
FIG. 1 is a cross-sectional diagram showing a display substrate according to one embodiment of the present disclosure.
Figure 2:
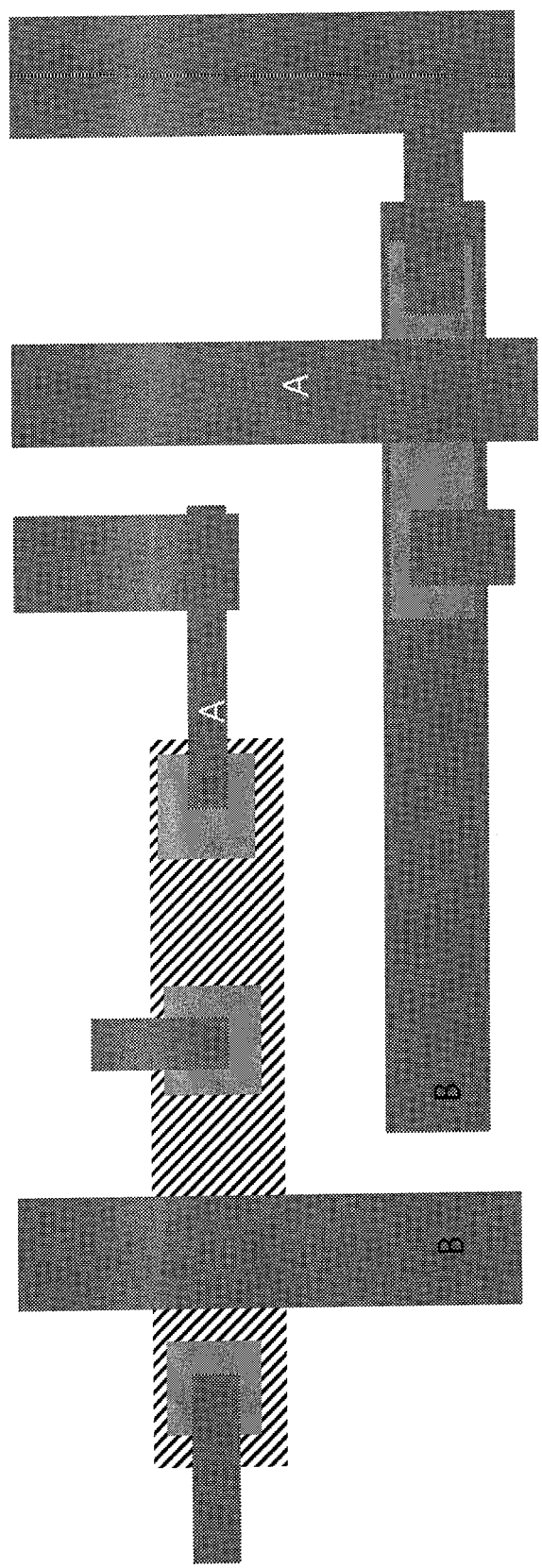
FIG. 2 is a top view diagram showing a display substrate according to one embodiment of the present disclosure.

One embodiment of the present disclosure provides a display substrate. As shown in FIGS. 1 and 2, the display substrate includes a substrate 1, a first transistor 2 and a second transistor 3 disposed on the substrate 1. Under driving voltages with opposite polarities, each of the first transistor 2 and the second transistor 3 has an intrinsic threshold voltage shift, and intrinsic threshold voltages of the two transistors shift in opposite directions. The display substrate further includes a shift adjustment structure 4 disposed on the substrate 1 to introduce an adjustment signal for the first transistor 2 and the second transistors 3, respectively to make the threshold voltages of the first transistor 2 and the second transistor 3 shift respectively in directions opposite to the directions of their intrinsic threshold voltage shifts.

In an operating state, the first transistor 2 and the second transistor 3 have intrinsic threshold voltage shifts under driving voltages of opposite polarities, and the directions of the intrinsic threshold voltage shifts are opposite. The operating state refers to the on state (i.e., the transistors are turned on) of the first transistor 2 and the second transistor 3. When the first transistor 2 and the second transistor 3 are in the off state (i.e., the transistors are turned off), their driving voltages are zero. The intrinsic threshold voltage shifts mainly refer to the original threshold voltage shifts of the first transistor 2 and the second transistor 3. Since the driving voltages of the first transistor 2 and the second transistor 3 are opposite in polarity in the on state, one of the threshold voltages of the two transistors shifts in a positive direction, and the other thereof in a negative direction. Thus, the original threshold voltages of the two transistors shift in opposite directions. In consideration of reducing power consumption of the display substrate, the first transistor 2 and the second transistor 3 are usually disposed in the display substrate. However, the intrinsic threshold voltage shift tends to be more severe due to the difference in process matching between the two transistors. That is, the intrinsic threshold voltages of the two transistors shift further in opposite directions (i.e., the threshold voltages inverse shift), which may cause a malfunction of the first transistor 2 and the second transistor 3, thereby resulting in inoperability.

Figure 3:
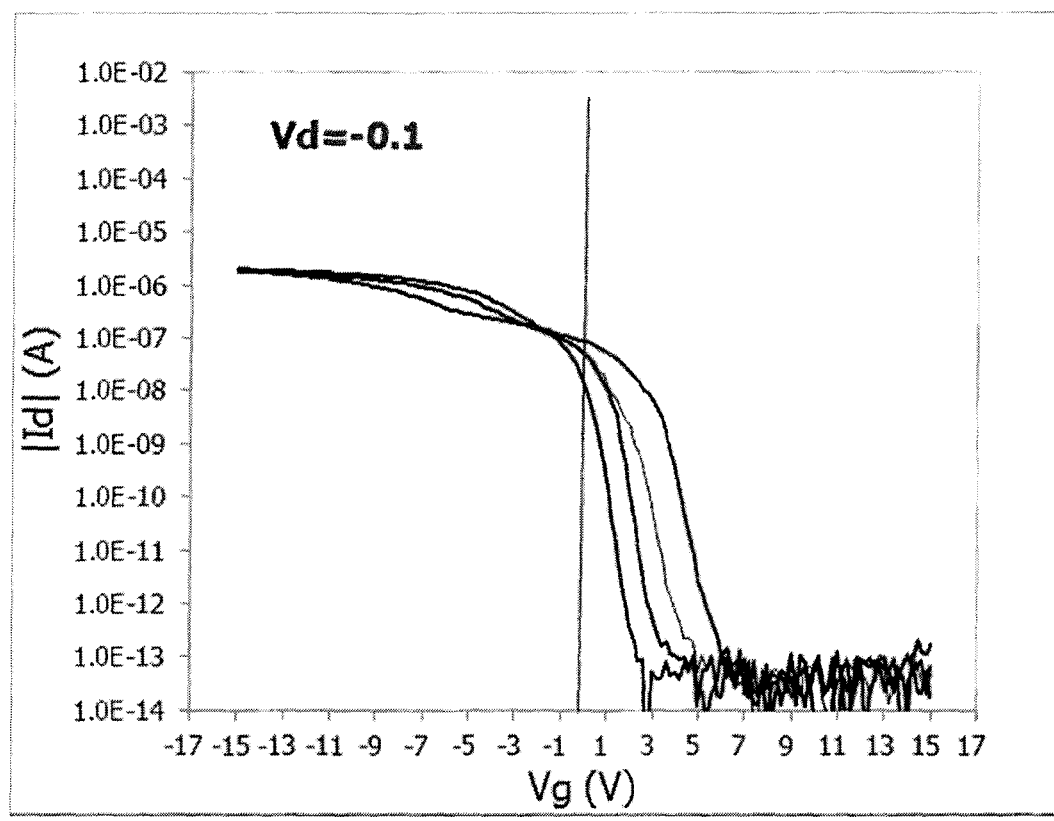
FIG. 3 shows a threshold voltage shift curve of a low temperature poly silicon transistor in a display substrate before adjusting the threshold voltage shift.
Figure 4:
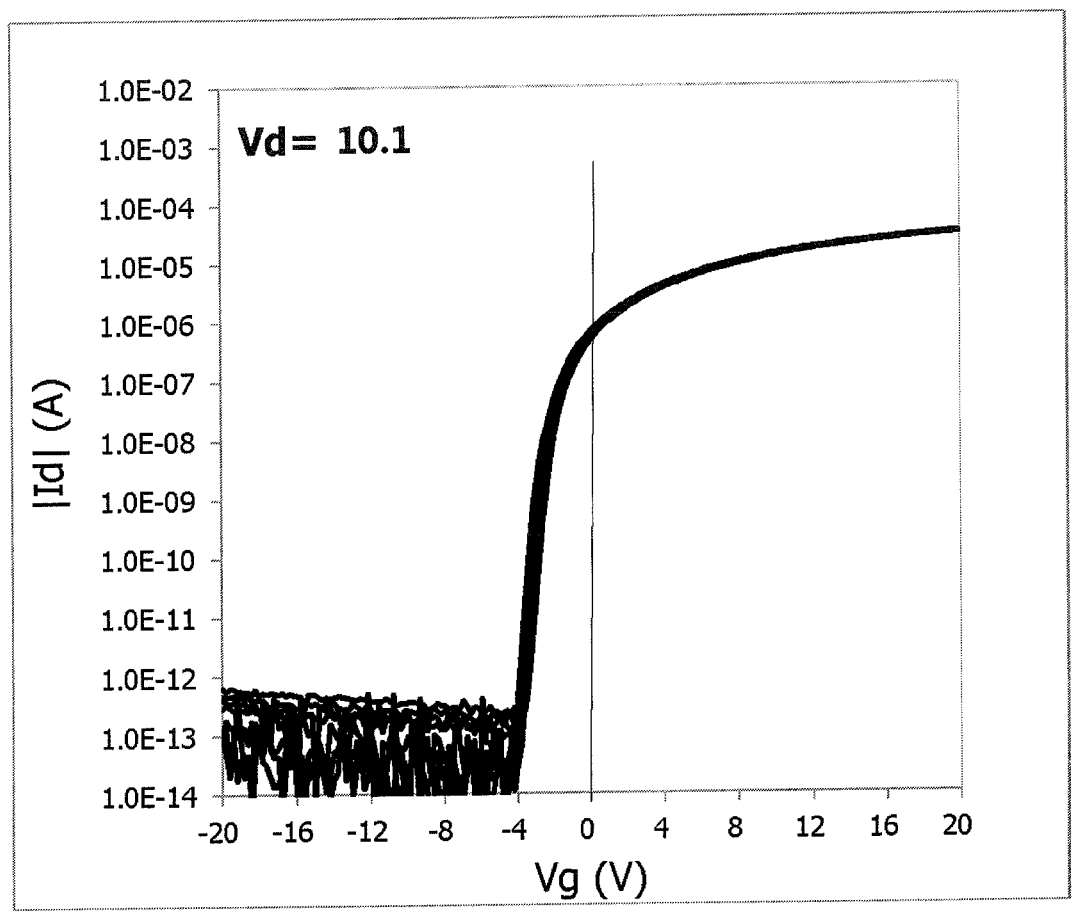
FIG. 4 shows a threshold voltage shift curve of an oxide semiconductor transistor in a display substrate before adjusting the threshold voltage shift.

In one embodiment, the first transistor 2 is a low temperature polysilicon transistor, and the second transistor 3 is an oxide semiconductor transistor. As shown in FIG. 3 and FIG. 4, the low temperature polysilicon transistor has a positive intrinsic threshold voltage shift, and the oxide semiconductor transistor has a negative intrinsic threshold voltage shift. The two transistors are fabricated in the display substrate. Therefore, the opposite shifts of the intrinsic threshold voltages are more severe. The two transistors may leak current at the same time, which could eventually cause the display substrate unable to reduce the power consumption. If the threshold voltages of the two transistors shift excessively in opposite directions, the apparatus may not operate and display substrate failure may occur.

In one embodiment, by setting the shift adjustment structure 4, the threshold voltages inverse shift of the first transistor 2 and the second transistor 3 can be adjusted by introducing adjustment signals. Therefore, inoperability caused by the excessive threshold voltages inverse shift may be reduced or avoided in the first transistor 2 and the second transistor 3, thereby reducing or avoiding defects of the display substrate, and improving the product reliability and yield.

Figure 5:
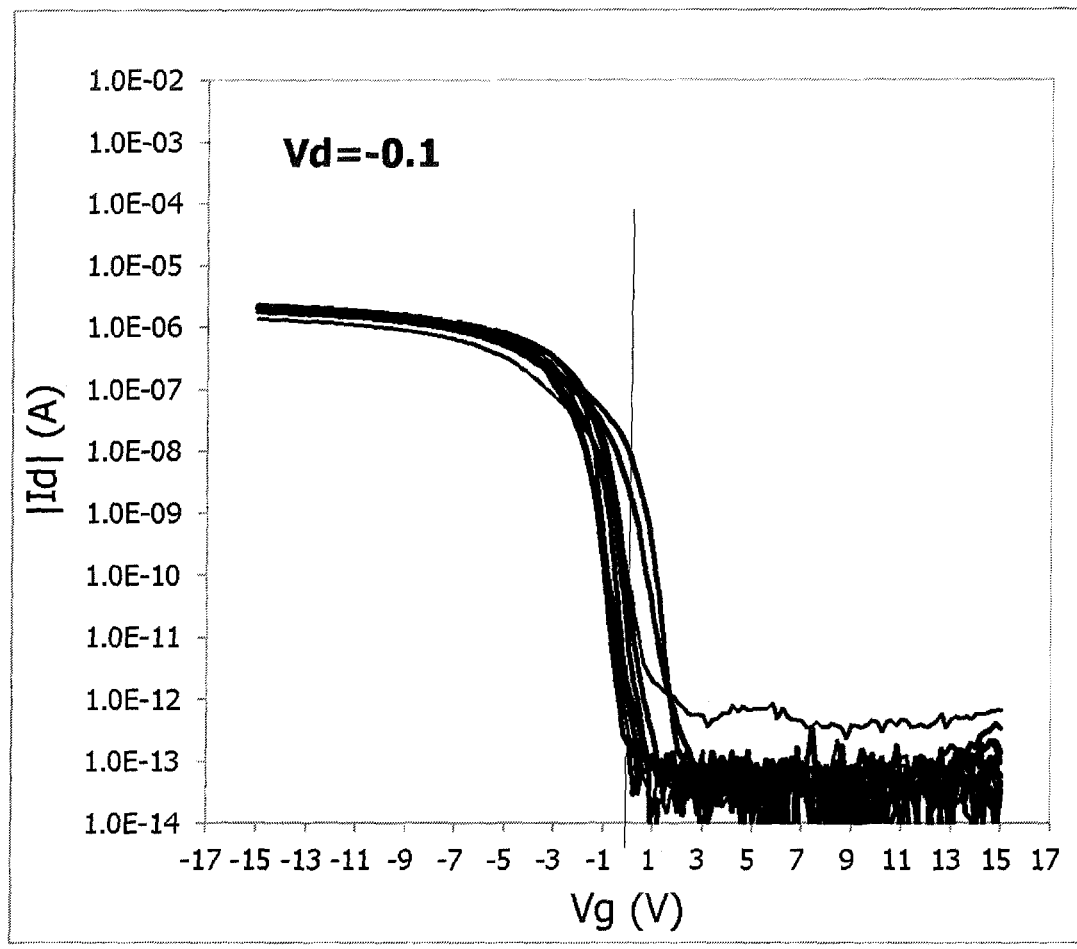
FIG. 5 shows a threshold voltage shift curve of a low temperature polysilicon transistor in a display substrate after adjusting the threshold voltage shift according to one embodiment of the present disclosure.
Figure 6:
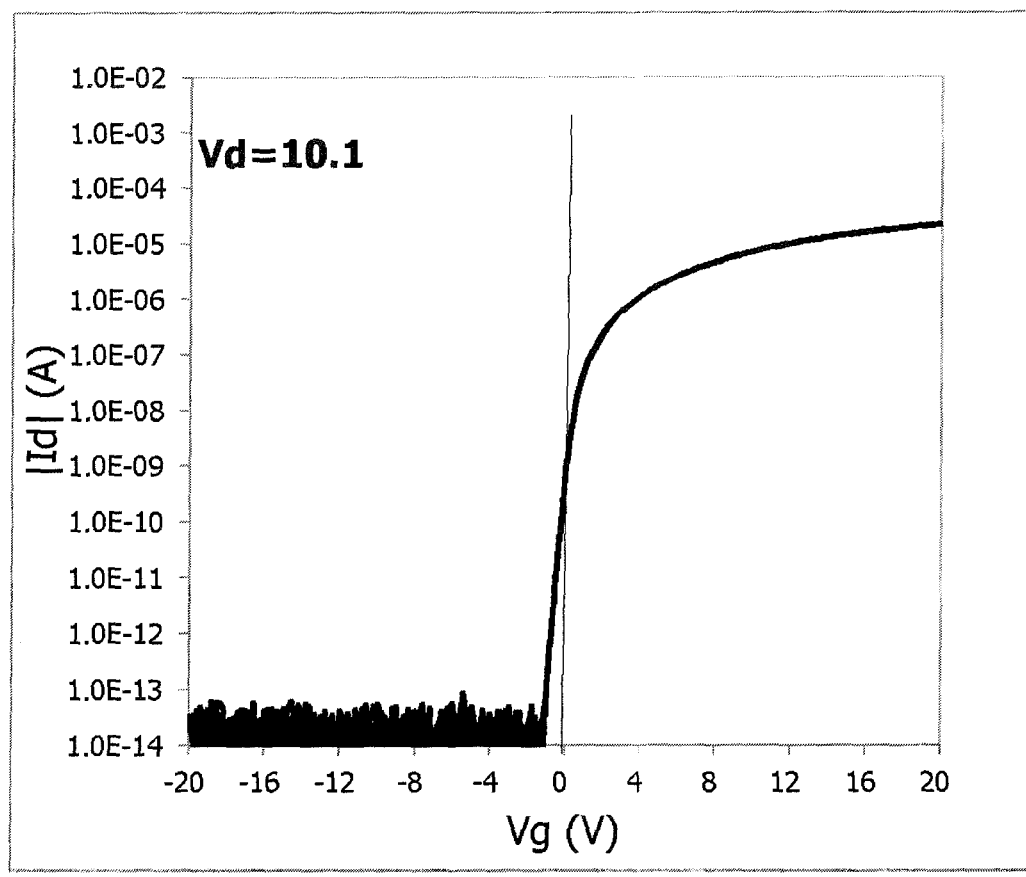
FIG. 6 shows a threshold voltage shift curve of an oxide semiconductor transistor in a display substrate after adjusting the threshold voltage shift according to one embodiment of the present disclosure.

In one embodiment, the shift adjustment structure 4 includes an adjustment signal source, a switch unit, and a signal lead. The adjustment signal source is connected to the switch unit, and the switch unit is connected to the signal lead. The adjustment signal source is used to generate the adjustment signals to adjust the intrinsic threshold voltage shifts of the first transistor 2 and the second transistor 3. The switching unit is used to turn the adjustment signal source on or off. The signal lead includes a first lead 41 and a second lead 42. The first lead 41 is disposed corresponding to the first transistor 2 for introducing a first adjustment signal to the first transistor 2. The second lead 42 is disposed corresponding to the second transistor 3 for introducing a second adjustment signal to the second transistor 3. By introducing the adjustment signals of opposite polarity to the first transistor 2 and the second transistor 3 respectively, the threshold voltages of the first transistor 2 and the second transistor 3 can respectively shift to a direction opposite to the direction of its intrinsic threshold voltage shift, thereby reducing or weakening the threshold voltages inverse shift of the first transistor 2 and the second transistor 3, as shown in FIG. 5 and FIG. 6. Therefore, apparatus defects caused by excessive threshold voltages inverse shift are reduced or avoided, thereby reducing or avoiding defective display substrates caused by apparatus defects and improving the product reliability and yield.

In one embodiment, the first transistor 2 and the second transistor 3 are top gate transistors, the first lead 41 is disposed at a side of the first transistor 2 facing the substrate 1, and the second lead 42 is disposed at a side of the second transistor 3 facing the substrate 1. The first lead 41 forms the bottom gate of the first transistor 2, and the second lead 42 forms the bottom gate of the second transistor 3. By applying adjustment signals to the bottom gate of the first transistor 2 and the bottom gate of the second transistor 3 correspondingly, their respective intrinsic threshold voltage shifts can be adjusted to shift in opposite directions, thereby reducing or weakening the threshold voltages inverse shift of the first transistor 2 and the second transistor 3. In addition, the arrangement of the first lead 41 and the second lead 42 makes the first transistor 2 and the second transistor 3 respectively form a double gate structure. The double gate structure can reduce the leakage current of the transistor, and the transistor performance of the double gate structure is more stable.

In one embodiment, the display substrate further includes a first conductive layer disposed on the substrate 1 and located on a side of the first transistor 2 and the second transistor 3 facing the substrate 1. The first lead 41 and the first conductive layer are made of the same material and disposed in the same layer. The second lead 42 and the gate of the first transistor 21 are made of the same material and disposed in the same layer. The first conductive layer is made of a light shielding metal material, mainly for blocking light. The first conductive layer can block the light from irradiating the first transistor 2 and the second transistor 3, thereby reducing the leakage current of the first transistor 2 and the second transistor 3 to achieve lower power consumption of the display substrate. The first lead 41 and the first conductive layer are made of the same material and are disposed in the same layer, which does not increase the fabrication process and can reduce the manufacturing cost of the display substrate. Similarly, the second lead 42 and the gate of the first transistor 2 are made of the same material and are disposed in the same layer setting, which does not increase the fabrication process and can reduce the manufacturing cost of the display substrate. Thus, the display substrate can achieve the adjustment of the threshold voltages inverse shift of the first transistor 2 and the second transistor 3 under the premise of minor changes in the original fabrication processes.

In one embodiment, the adjustment signal source includes a first signal source for generating a first adjustment signal to adjust the intrinsic threshold voltage shift of the first transistor 2, and a second signal source for generating a second adjustment signal to adjust the intrinsic threshold voltage shift of the second transistor 3. In one embodiment, the gate driving signal source of the first transistor 2 is reused as the second signal source, and the gate driving signal source of the second transistor 3 is reused as the first signal source. That is, the gate driving voltage of the first transistor 2 is used as a second adjustment signal that is supplied to the second lead 42 to adjust the threshold voltage of the second transistor 3 to shift in a direction opposite to the direction of its intrinsic threshold voltage shift. The gate driving voltage of the second transistor 3 is used as a first adjustment signal that is supplied to the first lead 41 to adjust the threshold voltage of the first transistor 2 to shift in a direction opposite to the direction of its intrinsic threshold voltage shift. In this way, the display substrate does not need an additional adjustment signal source, thereby saving the adjustment cost of the threshold voltage shift in the first transistor 2 and the second transistor 3 of the display substrate.

In one embodiment, the first transistor 2 is a PNP transistor, and the second transistor 3 is an NPN transistor. The driving voltage of the first transistor 2 is negative, and the driving voltage of the second transistor 3 is positive. By supplying the driving voltages of the two transistors respectively to each other as the threshold voltage shift adjustment signals, the degree of the threshold voltages inverse shift can be reduced or weakened in the first transistor 2 and the second transistor 3. As a result, apparatus defects caused by excessive threshold voltages inverse shift can be reduced or avoided, thereby reducing the adjustment cost of the threshold voltage shift in the display substrate.

It should be noted that the first transistor 2 and the second transistor 3 may also be PNP type transistors or both are NPN type transistors. As long as the driving voltages of the two are opposite in polarity, the threshold voltage shift can be adjusted by the adjustment implementation method described in one embodiment to reduce the threshold voltages inverse shift.

In one embodiment, the first transistor 2 is a low temperature polysilicon transistor and the second transistor 3 is an oxide semiconductor transistor. In the display substrate, some main switching transistors use oxide semiconductor transistors, and most of the other switching transistors and driving transistors use low-temperature polysilicon transistors. Since the leakage current of the oxide semiconductor transistors is low, comparing with all switching transistors using low-temperature polysilicon transistors in the display substrate in the related art, the leakage current can be significantly reduced, thereby further lowering power consumption of the display substrate.

In one embodiment, as shown in FIG. 1, the display substrate further includes a first insulating layer 5. The first insulating layer 5 is below the gate 21 of the first transistor 2, and the source 22 and the drain 23 of the first transistor 2 are above the first insulating layer 5. The first insulating layer 5 also extends between the active layer 34 of the second transistor 3 and the second lead 42. Via holes are provided in positions of the first insulating layer 5 corresponding to the gate 21, the source 22 and the drain 23 of the first transistor 2. A contact layer 6 is disposed in each of the via holes. The contact layer 6 and the active layer 34 of the second transistor 3 are made of the same material and are disposed in the same layer. Comparing to the existing fabrication process which requires another material and a separate process to form the contact layer in the via holes in the first insulating layer 5 at positions corresponding to the gate electrode 21, the source electrode 22 and the drain electrode 23 of the first transistor 2, the fabrication of the contact layer 6 according to one embodiment of the present disclosure does not additionally increase the fabrication process of the display substrate, and can lower the fabrication cost of the contact layer 6. That is, the fabrication of the contact layer 6 according to one embodiment of the present disclosure does not need to be separately prepared using other materials.

It should be noted that, in one embodiment, the first transistor 2 is further provided with a second insulating layer 7 on the contact layer 6, and the second insulating layer 7 also extends above the gate 31 of the second transistor 3. The second insulating layer 7 is provided with via holes at positions corresponding to the gate 21, the source 22 and the drain 23 of the first transistor 2, and the positions of the via holes in the second insulating layer 7 correspond to the positions of the via holes in the first insulating layer 5. The source and drain materials of the first transistor 2 are deposited in the via holes corresponding to the positions of the source 22 and drain 23. The material in the via hole corresponding to the position of the gate 21 of the first transistor 2 in the second insulating layer 7 is used to introduce a driving signal to the gate 21. The second insulating layer 7 is provided with via holes at the positions corresponding to the gate 31, the source 32 and the drain 33 of the second transistor 3. The source and drain materials of the second transistor 3 are deposited in the via holes corresponding to the positions of the source 32, and the drain 33. The source and drain material in the via hole corresponding to the position of the gate 21 of the first transistor 2 in the second insulating layer 7 is used to introduce a driving signal to the gate 21. In addition, a gate insulating layer 25 is further disposed between the gate electrode 21 of the first transistor 2 and the active layer 24. A gate insulating layer 35 is further disposed between the gate 31 of the second transistor 3 and the active layer 34. A buffer layer 8 is further disposed between the first lead 41 and the active layer 24 of the first transistor 2, and the buffer layer 8 also extends between the second transistor 3 and the substrate 1.

The source 22 and the drain 23 of the first transistor 2 and the source 32 and the drain 33 of the second transistor 3 are made of the same material and are disposed in the same layer, that is, the sources and the drains of the two transistors are formed by a one-step process. As shown in FIG. 1, the input signals of the two A positions in the display substrate are the same, and the input signals of the two B positions are the same. That is, when adjusting the threshold voltages shifts of the first transistor 2 and the second transistor 3, the first lead 41 inputs a gate driving signal of the second transistor 3 and the second lead 42 inputs a gate driving signal of the first transistor 2.

In one embodiment, the display substrate is divided into a plurality of regions, and each of the regions is provided with a first transistor and a second transistor. The first lead and the second lead in one region are correspondingly configured with a switch unit. In this way, the threshold voltages shift adjustment of the first transistor and the second transistor in each region can be separately controlled. Therefore, the threshold voltages shift adjustment can be performed separately in the regions where the transistors are inoperable due to large threshold voltage shifts. The shift adjustment does not need to be performed on all the transistors of the entire display substrate, thereby improving the pertinence and efficiency of the threshold voltages shift adjustment in the display substrate.

In one embodiment, the fabrication process of the display substrate of the above structure includes the following:

Step 01 includes forming a first conductive layer and a first lead on a substrate, and then forming a buffer layer on the substrate;

Step 02 includes forming an active layer, a gate insulating layer, a gate of the first transistor (low temperature polysilicon transistor), and performing a conducting treatment on two sides of the active layer of the first transistor, wherein the gate insulating layer of the first transistor further extends below the second lead of the second transistor (oxide semiconductor transistor).

Step 03 includes forming a first insulating layer and etching the first insulating layer, reserving first signal connection holes connected to the first lead, the source, drain, and gate of the first transistor, and then forming an active layer of the second transistor, wherein the material of the active layer of the second transistor is used at the first signal connection holes to form a contact layer respectively.

Step 04 includes forming a gate insulating layer and a gate of the second transistor sequentially, and performing a conducting treatment on two sides of the active layer of the second transistor.

Step 05 includes depositing a second insulating layer film and etching the second insulating layer film, reserving second signal connection holes connected to the first lead, the source, drain, and gate of the first transistor, and the source, drain, and gate of the second transistor at the corresponding positions, and then forming a source and a drain of the first transistor, a source and a drain of the second transistor, and at the same time forming a layer of the source and drain material in the second signal connection holes corresponding to the gate of the first transistor, the gate of the second transistor, and the first lead.

Step 06 includes performing subsequent fabrication processes of the display substrate.

Based on the above structure of the display substrate, another embodiment of the present disclosure further provides a method for adjusting a display substrate. The method includes the following:

In on embodiment, when the display substrate has a displaying defect due to the intrinsic threshold voltage shifts in opposite directions of the first transistor and the second transistor, the shift adjustment structure introduces adjustment signals to the first transistor and the second transistor such that the threshold voltages of the first transistor and the second transistor respectively shift in directions opposite to the directions of their intrinsic threshold voltage shifts.

Adjustment signals having opposite polarity are introduced to the first transistor and the second transistor.

In one embodiment, the first adjustment signal and the second adjustment signal may be not equal in magnitude. The first adjustment signal and the second adjustment signal may be equal in magnitude but may be unequal in input duration. In this way, the threshold voltages shift adjustment can be achieved in the first transistor and the second transistor having different threshold voltage shifts. A larger adjustment signal or a longer input duration is applied to the transistor having a larger threshold voltage shift between the first transistor and the second transistor.

It should be noted that if the threshold voltages of the first transistor and the second transistor shift to the same level, the first adjustment signal and the second adjustment signal may be equal in magnitude and the input duration may also be equal, as long as the threshold voltage shifts of the two transistors can be finally adjusted not to affect the normal operation.

In one embodiment, the threshold voltage shift of the first transistor and the second transistor on the display substrate is subjected to adjustment according to different regions.

In one embodiment, the method for adjusting the display substrate includes the following steps:

Step 11 includes marking abnormal display regions of the display substrate when performing the display substrate test.

Step 12 includes, in the abnormal display regions, turning on signal switching units in the first lead and the second lead to apply a gate driving signal of the first transistor to the second lead while applying a gate driving signal of the second transistor to the first lead, thereby adjusting the intrinsic threshold voltage shifts of the first transistor and the second transistor to obtain a performance optimized display substrate;

Step 13 includes turning off the signal switching units in the first lead and the second lead, and performing the subsequent processes on the display substrate having adjusted threshold voltage shifts.

In one embodiment, the display substrate may have the following beneficial effects. By setting the shift adjustment structure, the threshold voltages inverse shift of the first transistor 2 and the second transistor 3 can be adjusted by introducing an adjustment signal. Therefore, inoperability may be reduced or avoided in the first transistor 2 and the second transistor 3 due to the excessive threshold voltage crossing shift, thereby reducing or avoiding defects of the display substrate caused by excessive threshold voltage crossing shift in the first transistor 2 and the second transistor 3, and improving the product reliability and yield.

Another embodiment of the present disclosure provides a display apparatus including the display substrate according to one embodiment of the present disclosure.

By using the display substrate described above, not only the power consumption of the display apparatus is lowered, but also the reliability and yield of the display apparatus are improved.

In one embodiment, the display apparatus may be any product or component having a display function, such as an OLED panel, an OLED TV, an LCD panel, an LCD TV, a display, a mobile phone, a navigator, or the like, or a semi-finished product of the above-mentioned product or component having a display function.

It should be understood that the above embodiments are merely exemplary embodiments employed to explain the principles of the present disclosure, but not limited thereto. Various modifications and improvements can be made by those skilled in the art without departing from the spirit and scope of the present disclosure. These modifications and improvements are also considered to be within the scope of the present disclosure.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Connected" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

What is claimed is:

1. A display substrate, comprising:
   a substrate;
   a first transistor and a second transistor on the substrate, directions of intrinsic threshold voltage shifts of the first transistor and the second transistor being opposite; and
   a shift adjustment structure on the substrate;
   wherein the shift adjustment includes a signal lead and the signal lead includes a first lead and a second lead;
   the first transistor includes a first gate electrode and a first active layer and the first lead is disposed under the first active layer;
   the second transistor includes a second gate electrode and a second active layer and the second lead is disposed under the second active layer; and
   the first lead is electrically connected to the second gate electrode and the second lead is electrically connected to the first gate electrode; and
   the shift adjustment structure is configured to input adjustment signals to the first transistor from the first lead and the second transistor from the second lead respectively to make threshold voltages of the first transistor and the second transistor shift in directions opposite to the directions of their intrinsic threshold voltage shifts respectively.

2. The display substrate according to claim 1, wherein:
   the shift adjustment structure comprises an adjustment signal source, a switch unit and the signal lead, the adjustment signal source is connected to the switch unit, and the switch unit is connected to the signal lead;
   the adjustment signal source is configured to generate a first adjustment signal and a second adjustment signal that adjust the intrinsic threshold voltage shifts of the first transistor and the second transistor respectively;
   the switch unit is configured to turn on or off the adjustment signal source; and
   the signal lead comprises the first lead and the second lead, the first lead is configured to input the first adjustment signal to the first transistor, and the second lead is configured to input the second adjustment signal to the second transistor.

3. The display substrate according to claim 2, wherein the first transistor and the second transistor are top gate transistors, the first lead is at a side of the first transistor facing the substrate, and the second lead is at a side of the second transistor facing the substrate.

4. The display substrate according to claim 3, wherein the first lead forms a bottom gate of the first transistor, and the second lead forms a bottom gate of the second transistor, thereby making the first transistor and the second transistor respectively form a double gate structure.

5. The display substrate according to claim 3, further comprising a first conductive layer on the substrate and at the side of the first transistor and the second transistor facing the substrate; wherein:
the first lead and the first conductive layer are made of a same material and are disposed in a same layer.

6. The display substrate according to claim 5, wherein the second lead and a gate of the first transistor are made of a same material and are disposed in a same layer.

7. The display substrate according to claim 6, wherein:
the adjustment signal source comprises a first signal source and a second signal source, the first signal source is configured to generate the first adjustment signal, and the second signal source is configured to generate the second adjustment signal.

8. The display substrate according to claim 7, wherein a gate driving signal source of the first transistor is reused as the second signal source, and a gate driving signal source of the second transistor is reused as the first signal source.

9. The display substrate according to claim 1, wherein the first transistor is a PNP transistor and the second transistor is an NPN transistor.

10. The display substrate according to claim 9, wherein the first transistor is a low temperature polysilicon transistor and the second transistor is an oxide semiconductor transistor.

11. The display substrate according to claim 10, further comprising a first insulating layer, wherein:
the first insulating layer is below the gate of the first transistor and below a source and a drain of the first transistor, the first insulating layer further extends between the second lead and an active layer of the second transistor;
the first insulating layer comprises via holes at positions corresponding to the gate, the source, and the drain of the first transistor, a contact layer is in each of the via holes, and the contact layer and the active layer of the second transistor are made of a same material and arranged in a same layer.

12. The display substrate according to claim 11, further comprising a second insulating layer on the contact layer, wherein the second insulating layer also extends above the active layer of the second transistor.

13. The display substrate according to claim 12, further comprising a gate insulating layer between the gate and the active layer of the first transistor and between the gate and the active layer of the second transistor.

14. The display substrate according to claim 2, wherein:
the display substrate comprises a plurality of regions, each of the plurality of regions comprising the first transistor and the second transistor.

15. The display substrate according to claim 14, wherein each of the plurality of regions further comprises the first lead and the second lead which are correspondingly configured to connect with the switch unit.

16. A display apparatus comprising the display substrate according to claim 1.

* * * * *